(12) United States Patent
Kim

(10) Patent No.: US 6,969,655 B2
(45) Date of Patent: Nov. 29, 2005

(54) METHOD OF FABRICATING A SEMICONDUCTOR DEVICE THAT INCLUDES REMOVING A RESIDUAL CONDUCTING LAYER FROM A SIDEWALL SPACER CORRESPONDING TO A GATE ELECTRODE OF A FLASH MEMORY

(75) Inventor: Seok Su Kim, Gyeonggi-do (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 0 days.

(21) Appl. No.: 10/745,853

(22) Filed: Dec. 26, 2003

(65) Prior Publication Data

US 2004/0137669 A1    Jul. 15, 2004

(30) Foreign Application Priority Data

Dec. 31, 2002   (KR) ...................... 10-2002-0087893

(51) Int. Cl.[7] .......................................... H01L 21/4763
(52) U.S. Cl. ...................... 438/267; 438/596
(58) Field of Search ................ 438/257, 266, 438/267, 593, 595, 596

(56) References Cited

U.S. PATENT DOCUMENTS

| 6,001,688 A | 12/1999 | Rizzuto | 438/264 |
| 6,165,845 A * | 12/2000 | Hsieh et al. | 438/260 |
| 6,232,185 B1 * | 5/2001 | Wang | 438/266 |
| 6,284,596 B1 * | 9/2001 | Sung et al. | 438/257 |
| 6,348,378 B1 * | 2/2002 | Lee | 438/257 |
| 6,455,440 B1 | 9/2002 | Jeng | 438/770 |
| 6,589,842 B2 * | 7/2003 | Huang | 438/261 |
| 6,642,116 B2 * | 11/2003 | Lin | 438/286 |

FOREIGN PATENT DOCUMENTS

JP    2002-026159 A    1/2002

* cited by examiner

Primary Examiner—Stephen W. Smoot
(74) Attorney, Agent, or Firm—Hanley, Flight & Zimmerman, LLC.

(57) ABSTRACT

Methods of fabricating semiconductor devices are disclosed. An example method may include providing a substrate including an active region and a non-active region and forming a first gate electrode comprising a dielectric layer pattern, a first conducting layer pattern, and a first insulating layer pattern, the first gate electrode functioning as a flash memory. The example method may also include forming spacers on sidewalls of the first gate electrode; forming a second gate electrode comprising a gate oxide, a second conducting layer pattern, and a second insulating layer pattern, the second gate electrode functioning as a normal gate electrode; and removing a residual conducting layer on one sidewall of the spacer.

4 Claims, 3 Drawing Sheets

-- Prior Art --

-- Prior Art --

-- Prior Art --

METHOD OF FABRICATING A SEMICONDUCTOR DEVICE THAT INCLUDES REMOVING A RESIDUAL CONDUCTING LAYER FROM A SIDEWALL SPACER CORRESPONDING TO A GATE ELECTRODE OF A FLASH MEMORY

TECHNICAL FIELD

The present disclosure relates to semiconductors and, more particularly, to methods of fabricating semiconductor devices.

BACKGROUND

With the rapid spread of intelligent devices such as computers, semiconductor devices are rapidly being developed. Currently, semiconductor devices are required to have high storage-capability as well as high operating speeds. To meet these requirements, technologies for manufacturing semiconductor devices are being developed to improve the degree of integration, the level of reliability, and the response times of semiconductor devices.

Generally, semiconductor memory devices are divided into volatile and nonvolatile memory devices. Examples of the nonvolatile memory devices include flash memory devices, McRAM devices, etc. In particular, the McRAM device includes a first gate electrode functioning as a flash memory and a second gate electrode functioning as a normal gate electrode in a single cell. Recently, attention has been drawn to the McRAM devices because the McRAM devices possess advantages such as low power dissipation, low manufacturing cost, and rapid information processing speed.

FIGS. 1a through 1c illustrate, in cross-sectional views, the results of process steps for fabricating a McRAM device according to a conventional method.

Referring to FIG. 1a, a substrate 1 including an active region 2 and a non-active region 3 is provided. A first gate electrode 10 is formed on the active region 2 in the substrate 1. For example, the first gate electrode 10 may function as a flash memory. The first gate electrode 10 comprises a dielectric layer pattern 5a, a first conducting layer pattern 7a, and an insulating layer pattern 9a. Spacers 11 are then formed on sidewalls of the first gate electrode 10.

Referring to FIG. 1b, an oxide layer 13 is formed on the substrate 1 except the region of the first gate electrode 10 and the spacers 11. Then, a second conducting layer 15 is deposited over the oxide layer 13, the first gate electrode 10, and the spacers 11. A mask layer 17 is formed on the second conducting layer 15.

Referring to FIG. 1c, an etching process is performed using the mask layer 17 as an etching mask. Some parts of the second conducting layer 15 and the oxide layer 13 are removed to form a second conducting layer pattern 15a and a gate oxide 13a. Then, the mask layer 17 is removed. As a result, a second gate electrode 19 comprising the gate oxide 13a and the second conducting layer pattern 15a is formed on the active region 2 of the substrate 1. Here, the second gate electrode 19 functions as a normal gate electrode.

However, during the etching process to form the second gate electrode 19, a portion of the second conducting layer 15 remains on one sidewall of the spacer 11. Such residual conducting layer 20 may cause deterioration of device characteristics and, therefore, has to be removed. However, when the residual conducting layer 20 is removed, the second conducting layer pattern 15a of the second gate electrode 19 may be damaged.

To obviate deterioration of device characteristics due to residual materials in a semiconductor device, U.S. Pat. No. 6,455,440 to Jeng discloses a method for preventing polysilicon stringers in a memory device. The method for preventing conductive stringers in a memory device according to the above-mentioned U.S. patent comprises forming a conductive structure with a vertical profile on a substrate, wherein said conductive structure has at least two level oxidation rates, lower portion of said conductive structure higher said oxidation rates; performing an oxidation process to a portion of said conductive structure, such that said vertical profile of said conductive structure is changed to an increasing width profile from lower to higher portion of said conductive structure, wherein said increasing width profile of said conductive structure helps for etching process control; and etching said conductive structure with said increasing width profile to form a plurality of electrically isolated regions without any conductive stringers.

As another example, U.S. Pat. No. 6,001,688 to Rizzuto discloses a method of eliminating poly stringers in a memory device. A method of making a flash memory device without poly stringers according to the above-mentioned U.S. patent comprises forming a stacked gate region on a substrate, forming one or more word lines in the stacked gate region, performing a self-aligned etch in regions adjacent to the one or more word lines, and performing an isotropic etch to remove any poly stringers in the regions adjacent the one or more word lines. Particularly, the method includes a poly stringer clean-up etch that removes the poly stringers after a self-aligned etch (SAE) step that is used to define the separate word lines. The clean-up etch is isotropic and laterally etches the poly stringers that were previously shielded by the angled ONO fence during the SAE, thereby preventing short circuit conditions between word lines and improving the manufacturability of the process.

DETAILED DESCRIPTION

Figure 1A:
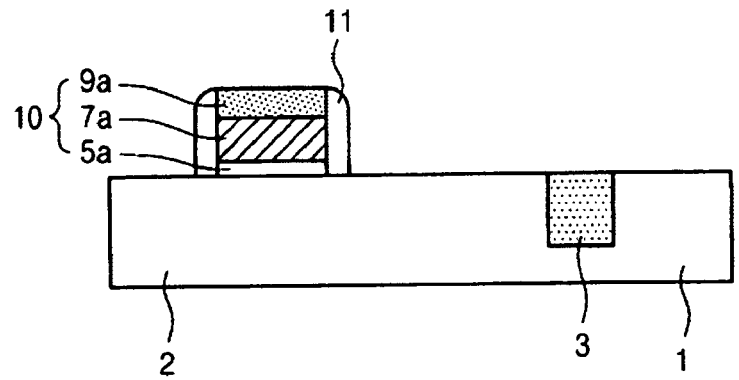
FIGS. 1a through 1c illustrate, in cross-sectional views, the results of the process steps for fabricating a McRAM device according to a conventional method.
Figure 1B:
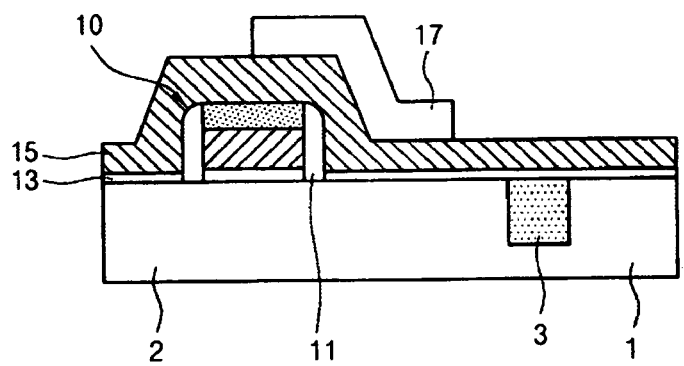
Figure 1C:
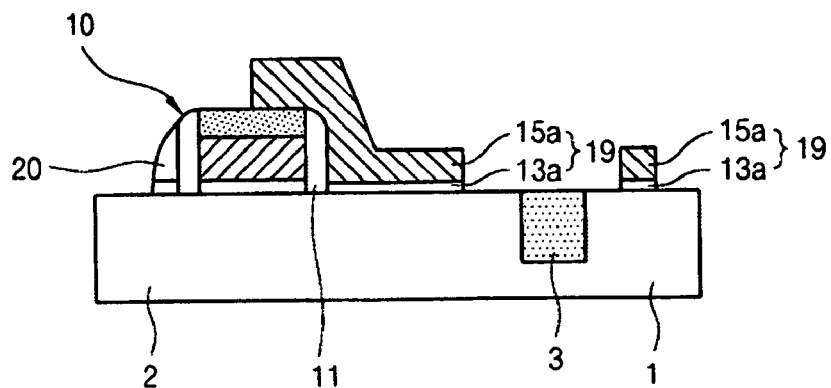
Figure 2A:
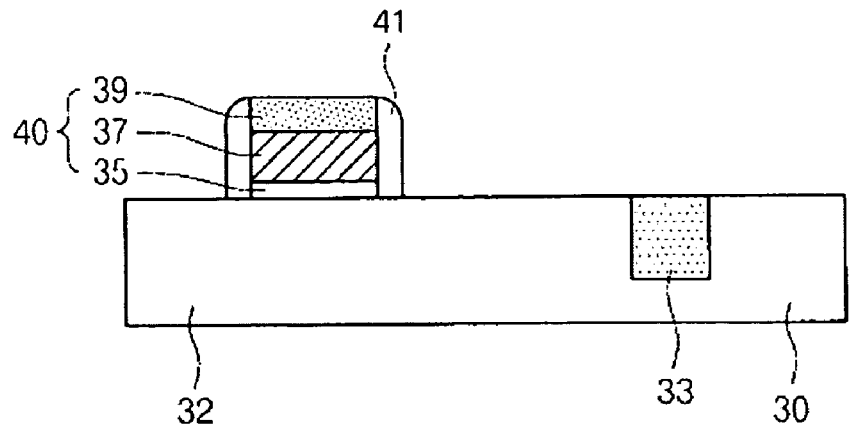
FIGS. 2a through 2d illustrate, in cross-sectional views, the results of the process steps for fabricating a semiconductor device according to an example disclosed method.

Referring to FIG. 2a, a substrate 30 including an active region 32 and a non-active region 33 is provided. The non-active region 33 may be, for example, a trench structure or field oxide formed by LOCOS (local oxidation of silicon). A dielectric layer, a first conducting layer, and a first insulating layer are deposited over the substrate 30 in sequence. The first conducting layer may be polysilicon and the first insulating layer may be oxide or nitride. Then, a photoresist pattern is formed on the first insulating layer by photolithography. Some parts of the dielectric layer, the first conducting layer, and the first insulating layer are removed through the photoresist pattern to form a dielectric layer pattern 35, a first conducting layer pattern 37, and a first insulating layer pattern 39, respectively. As a result, a first gate electrode 40 comprising the dielectric layer pattern 35, the first conducting layer pattern 37, and the first insulating layer pattern 39 is formed on the active region 32 of the substrate 30. The first gate electrode 40 functions, for example, as a flash memory. Next, a thin layer is deposited over the substrate 30. The thin layer is removed by an etch back process to form spacers 41 on sidewalls of the first gate electrode 40.

Figure 2B:
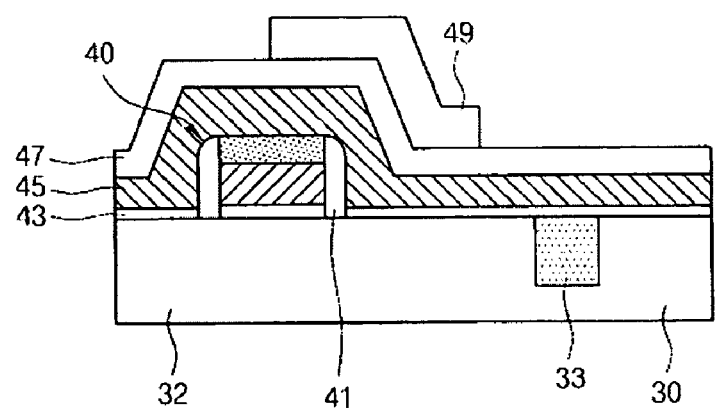

Referring to FIG. 2b, an oxide layer 43 is formed on the substrate 30 except the region of the first gate electrode 40 and the spacers 41. Then, a second conducting layer 45 is deposited over the substrate 30 including the first gate electrode 40, the spacers 41, and the oxide layer 43. A second insulating layer 47 is deposited on the second conducting layer. In such an arrangement, the second conducting layer 45 may be polysilicon and the second insulating layer 47 may be oxide. Next, a mask layer 49, which may be a photoresist pattern, is formed on the second insulating layer 47 by photolithography.

Figure 2C:
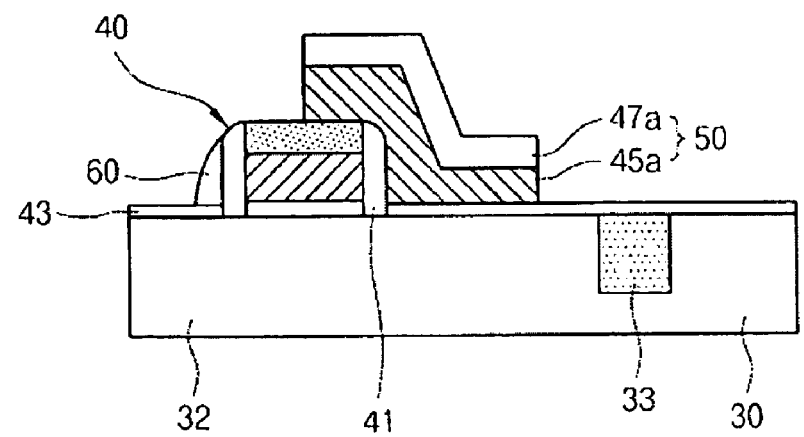

Referring to FIG. 2c, an etching process is performed using the mask layer 49 as an etching mask to remove some parts of the second insulating layer 47 and the second conducting layer 45. As a result, a second gate electrode 50 comprising a second insulating layer pattern 47a and a second conducting layer pattern 45a is formed on the active region 32 of the substrate 30. Here, the second gate electrode 50 functions as a normal gate electrode.

However, after the etching process is performed to form the second gate electrode 50, a residual conducting layer 60, which was not removed during the etching process, remains on one sidewall of the spacers 41 of the first gate electrode 40. The residual conducting layer 60 has to be removed because it may cause deterioration of device characteristics.

Figure 2D:
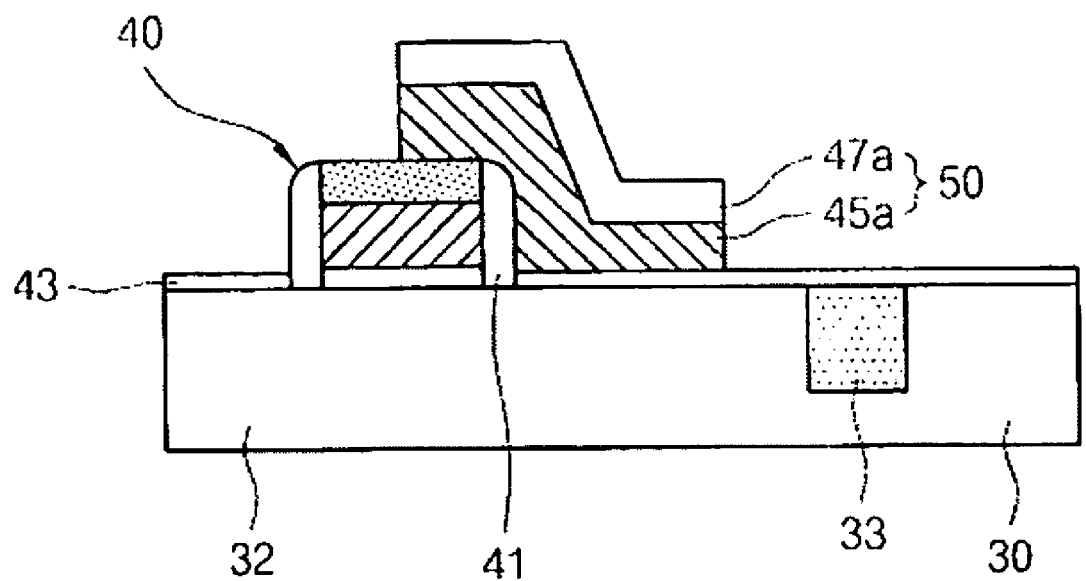

Referring to FIG. 2d, the residual conducting layer 60 is removed through an etching process. Here, the second conducting layer pattern 45a constituting the second gate electrode 50 can be protected by the second insulating layer pattern 47a formed on the second conducting layer pattern 45a. Therefore, the residual conducting layer 60 is easily removed while the second conducting layer pattern 45a is not damaged. Particularly, the residual conducting layer 60 can be removed more easily by an etching process adopting an appropriate etching selectivity between the residual conducting layer 60 and the second insulating layer pattern 47a. Here, the residual conducting layer 60 is removed by dry etching or wet etching.

Figure 3:
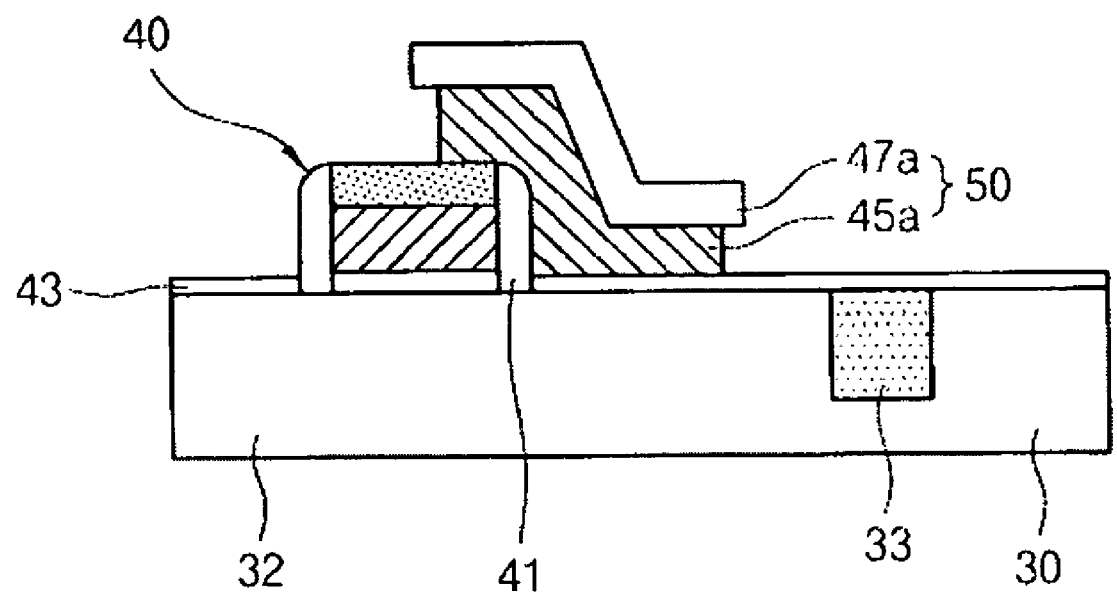
FIG. 3 illustrates, in a cross-sectional view, the results of a method of fabricating a semiconductor device according to a further example disclosed method.

Referring to FIG. 3, in case of using the wet etching, the residual conducting layer 60 is removed by isotropic etching. Here, a portion of the second conducting layer pattern 45a may be removed by the isotropic etching so that the wet etching does not influence device characteristics. Furthermore, the wet etching can suppress a bad effect on the substrate 30 during removal of the residual conducting layer 60, compared to the dry etching.

The disclosed example methods can easily remove an unnecessary residual conducting layer on a substrate, thereby reducing defects due to the residual conducting layer. In addition, a bad effect on the substrate due to the etching process can be reduced more or less because the residual conducing layer can be removed even by wet etching. Accordingly, the disclosed example methods can improve device reliability by easily removing causes of defects.

As disclosed herein, example methods may be used to remove residual material on a sidewall of a spacer without damaging a semiconductor substrate in fabricating a McRAM device. One example method may include providing a substrate including an active region and a non-active region, forming a first gate electrode comprising a dielectric layer pattern, a first conducting layer pattern, and a first insulating layer pattern, the first gate electrode functioning as a flash memory, and forming spacers on sidewalls of the first gate electrode. The method may further include forming a second gate electrode comprising a gate oxide, a second conducting layer pattern, and a second insulating layer pattern, the second gate electrode functioning as a normal gate electrode, and removing a residual conducting layer on one sidewall of the spacers.

In such an arrangement, the residual conducting layer may be removed by dry etching or wet etching adopting an appropriate etching selectivity. Particularly, in case of performing the wet etching, the second insulating layer pattern can mitigate damage due to the etching. The second conducting layer may be a polysilicon layer and the second insulating layer pattern may be an oxide layer.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of fabricating a semiconductor device, the method comprising:
   providing a semiconductor substrate having an active region and a non-active region;
   forming a first gate electrode comprising a dielectric layer pattern, a first conducting layer pattern, and a first insulating layer pattern over the active region, the first gate electrode functioning as a flash memory;
   forming spacers on sidewalls of the first gate electrode;
   forming an oxide layer on the semiconductor substrate except the region of the first gate electrode and the spacers;
   forming a second conducting layer and a second insulating layer over the substrate including the first gate electrode, the spacers and the oxide layer;
   forming a patterned mask layer on a predetermined region of the second insulating layer;
   forming a second gate electrode comprising a gate oxide, a second conducting layer pattern, and a second insulating layer pattern by performing a first etching process using the patterned mask layer as an etching mask to remove the second insulating layer and the second conducting layer except under the region of the mask layer, the second gate electrode functioning as a normal gate electrode; and
   removing a residual conducting layer on one sidewall of the spacers of the first gate electrode by performing a second etching process.

2. A method as defined by claim 1, wherein the second conducting layer pattern comprises a polysilicon layer and the second insulating layer pattern is an oxide layer.

3. A method as defined by claim 1, wherein the step of removing the residual conducting layer is a dry or wet etching process using an appropriate etching selectivity between the residual conducting layer and the second insulating layer pattern.

4. A method as defined by claim 1, wherein the first insulating layer pattern is an oxide or a nitride layer.

* * * * *